(12) United States Patent
Cheng et al.

(10) Patent No.: US 9,059,205 B2
(45) Date of Patent: Jun. 16, 2015

(54) METHOD OF MANUFACTURING A SEMICONDUCTOR DEVICE USING SOURCE/DRAIN EPITAXIAL OVERGROWTH FOR FORMING SELF-ALIGNED CONTACTS WITHOUT SPACER LOSS AND A SEMICONDUCTOR DEVICE FORMED BY SAME

(71) Applicant: International Business Machines Corporation, Armonk, NY (US)

(72) Inventors: Szu-Lin Cheng, Yorktown Heights, NY (US); Jack Oon Chu, Manhasset Hills, NY (US); Isaac Lauer, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 13/966,885

(22) Filed: Aug. 14, 2013

(65) Prior Publication Data

US 2015/0048428 A1    Feb. 19, 2015

(51) Int. Cl.
*H01L 21/336* (2006.01)
*H01L 29/66* (2006.01)
*H01L 29/78* (2006.01)

(52) U.S. Cl.
CPC ............. *H01L 29/665* (2013.01); *H01L 29/78* (2013.01)

(58) Field of Classification Search
CPC .................. H01L 21/28052; H01L 29/665
See application file for complete search history.

(56) References Cited

U.S. PATENT DOCUMENTS

| 7,879,707 | B2 | 2/2011 | Park | |
|---|---|---|---|---|
| 8,754,417 | B2* | 6/2014 | Christensen et al. | 257/67 |
| 8,853,862 | B2* | 10/2014 | Alptekin et al. | 257/775 |
| 2003/0164513 | A1* | 9/2003 | Ping et al. | 257/288 |
| 2009/0256201 | A1 | 10/2009 | Yang et al. | |
| 2011/0204446 | A1 | 8/2011 | Yang et al. | |
| 2012/0211844 | A1 | 8/2012 | Schloesser et al. | |
| 2013/0020616 | A1* | 1/2013 | Ayala et al. | 257/288 |

FOREIGN PATENT DOCUMENTS

KR    1020060072826 A    6/2006
KR    100811248 B1       3/2008

OTHER PUBLICATIONS

H.-J. Huang et al., "Reduction of Source/Drain Series Resistance and Its Impact on Device Performance for PMOS Transistors with Raised Si1-xGex Source/Drain," IEEE Electron Device Letters, Sep. 2000, pp. 448-450, vol. 21, No. 9.

\* cited by examiner

*Primary Examiner* — Long K Tran
(74) *Attorney, Agent, or Firm* — Louis J. Percello; Ryan, Mason & Lewis, LLP

(57) ABSTRACT

A method for manufacturing a semiconductor device comprises growing a source/drain epitaxy region over a plurality of gates on a substrate, wherein a top surface of the source/drain epitaxy region is at a height above a top surface of each of the plurality of gates, forming at least one opening in the source/drain epitaxy region over a top surface of at least one gate, forming a silicide layer on the source/drain epitaxy region, wherein the silicide layer lines lateral sides of the at least one opening, depositing a dielectric layer on the silicide layer, wherein the dielectric layer is deposited in the at least one opening between the silicide layer on lateral sides of the at least one opening, etching the dielectric layer to form a contact area, and depositing a conductor in the contact area.

19 Claims, 7 Drawing Sheets

100

METHOD OF MANUFACTURING A SEMICONDUCTOR DEVICE USING SOURCE/DRAIN EPITAXIAL OVERGROWTH FOR FORMING SELF-ALIGNED CONTACTS WITHOUT SPACER LOSS AND A SEMICONDUCTOR DEVICE FORMED BY SAME

TECHNICAL FIELD

The field generally relates to methods of manufacturing semiconductor devices and, in particular, to methods for manufacturing semiconductor devices using source/drain epitaxial overgrowth for forming self-aligned contacts without spacer loss.

BACKGROUND

The formation of electrical contacts to electronic and memory devices is a considerable challenge as a consequence of technology scaling, especially as pitch is reduced. In conventional methods for forming self-aligned contacts, formation of contact areas between gates by a dry etching process of an oxide, such as reactive ion etching (RIE), causes unwanted removal of spacer, hard mask and silicide regions. The etching process shows little or no etch selectivity with respect to the spacers formed along the gate structures (e.g., little or no etch selectivity between contact area oxide and nitride spacer). As a result, there is unwanted spacer, hard mask and silicide loss when forming the contact area vias between gates, resulting in gate to source/drain shorts when the spacer and silicide are removed by the etching process. Moreover, the combination of contact area misalignment and the RIE issues can cause high gate leakage and low yield.

Accordingly, there is a need for a process that is capable of making suitable contacts which are self-aligned to the source and drain, and avoids unwanted shorts.

SUMMARY

In general, exemplary embodiments of the invention include methods of manufacturing semiconductor devices and, in particular, to methods for manufacturing semiconductor devices using source/drain epitaxial overgrowth for forming self-aligned contacts without spacer loss.

According to an exemplary embodiment of the present invention, a method for manufacturing a semiconductor device, comprises growing a source/drain epitaxy region over a plurality of gates on a substrate, wherein a top surface of the source/drain epitaxy region is at a height above a top surface of each of the plurality of gates, forming at least one opening in the source/drain epitaxy region over a top surface of at least one gate, forming a silicide layer on the source/drain epitaxy region, wherein the silicide layer lines lateral sides of the at least one opening, depositing a dielectric layer on the silicide layer, wherein the dielectric layer is deposited in the at least one opening between the silicide layer on lateral sides of the at least one opening, etching the dielectric layer to form a contact area, and depositing a conductor in the contact area.

According to an exemplary embodiment of the present invention, a semiconductor device, comprises a substrate, a plurality of gates on the substrate, a source/drain region formed over the plurality of gates on a substrate, wherein a top surface of the source/drain region is at a height above a top surface of each of the plurality of gates, at least one opening in the source/drain epitaxy region over a top surface of at least one gate, a silicide layer formed on the source/drain region, wherein the silicide layer lines lateral sides of the at least one opening, a dielectric layer formed on the silicide layer, wherein the dielectric layer includes at least one contact area formed in the dielectric layer, and wherein the dielectric layer is formed in the at least one opening between the silicide layer on lateral sides of the at least one opening, and a conductor formed in the at least one contact area.

According to an exemplary embodiment of the present invention, a method for manufacturing a semiconductor device, comprises growing a source/drain epitaxy region to a height above a plurality of gates on a substrate, forming a plurality of openings in the source/drain epitaxy region respectively over top surfaces of each of the plurality of gates, forming a silicide layer on the source/drain epitaxy region, wherein the silicide layer lines lateral sides of the plurality of openings, and depositing a dielectric layer on the silicide layer, wherein the dielectric layer is deposited in the plurality of openings between the silicide layer on lateral sides of the plurality of openings.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Figure 1:
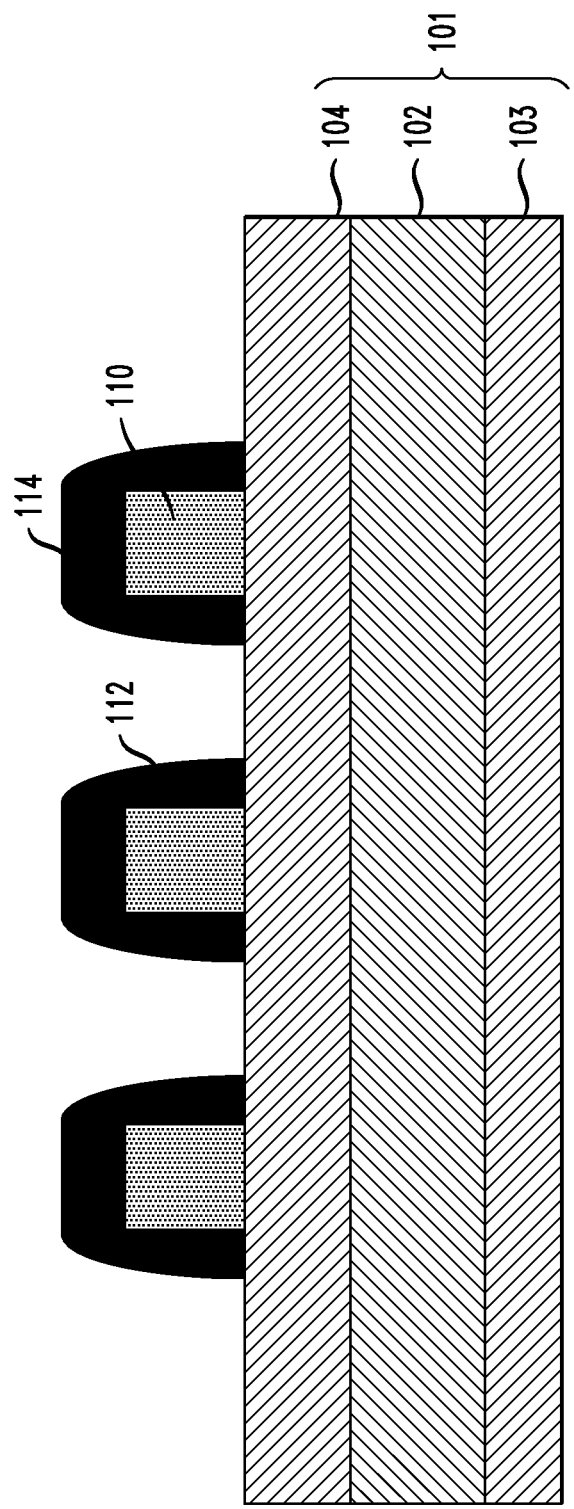
FIG. 1 is a cross-sectional view illustrating a device prior to source/drain formation in a method of manufacturing a semiconductor device, according to an exemplary embodiment of the present invention.

Exemplary embodiments of the invention will now be discussed in further detail with regard to methods of manufacturing semiconductor devices and, in particular, to a method for manufacturing a semiconductor device using source/drain epitaxial overgrowth for forming self-aligned contacts without spacer loss. This invention may, however, be embodied in many different forms and should not be construed as limited to the embodiments set forth herein.

The embodiments of the present invention include an overgrown epitaxial region, made from, for example, undoped or doped silicon (Si)/silicon germanium (SiGe), gallium arsenide, indium gallium arsenide, indium arsenide or indium phosphide, which is used as a source/drain region. The epitaxy region is selectively grown above the gate stack. According to an embodiment, the source/drain epitaxy region is selectively grown and merged over active area RX. The merged epitaxy region is patterned using reactive ion etching (RIE) for source/drain isolation. According to another embodiment, the source/drain epitaxy region is selectively grown over the active area, but is not merged, so no patterning using RIE is required to isolate the source/drains. Silicide is formed on the larger contact area above the gate, and contact resistance can be improved over prior devices.

The use of the overgrown source/drain epitaxial region adequately covers the gates and spacers surrounding the gates, so as to avoid unwanted material loss during contact area formation by etching, and resulting gate to source/drain shorts.

It is to be understood that the various layers and/or regions shown in the accompanying drawings are not drawn to scale, and that one or more layers and/or regions of a type commonly used in semiconductor devices described herein may not be explicitly shown in a given drawing. This does not imply that the layers and/or regions not explicitly shown are omitted from the actual semiconductor devices. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of the embodiments of the invention provided herein, one of ordinary skill in the art will be able to contemplate other implementations and applications of embodiments of the invention.

Referring to FIG. 1, which is a cross-sectional view illustrating a device 100 prior to source/drain formation in a method of manufacturing a semiconductor device, according to an exemplary embodiment of the present invention, a plurality of gate structures 110 are formed on a substrate 101, such as a semiconductor substrate, and surrounded by spacers 112 and a hard mask layer 114, formed of, for example, a dielectric material including, for example, silicon oxide, silicon nitride, silicon oxynitride, boron nitride, silicon boron nitride or multilayered stacks thereof.

In an embodiment, the substrate 101 is a semiconductor-on-insulator (SOI) substrate. Referring to FIG. 1, the SOI substrate includes a handle substrate 103, a buried insulating layer 102, such as, for example, a buried oxide or nitride layer, located on an upper surface of the handle substrate 101, and a semiconductor layer 104 located on an upper surface of the buried insulating layer 102. In accordance with an embodiment, the semiconductor layer 104 is processed into an active device region such as, for example, a semiconductor fin or a semiconductor nanowire. The handle substrate 103 and the semiconductor layer 104 may comprise the same or different semiconductor material. In addition, multiple layers of the semiconductor materials can be used as the semiconductor material of the handle substrate and the semiconductor layer.

In accordance with another embodiment of the present invention, the substrate 101 is a bulk semiconductor substrate omitting the buried insulating layer and having a semiconductor material including, but not limited to, Si, Ge, SiGe, SiC, SiGeC, InAs, GaAs, InP, InGaAs or other like semiconductor. Multiple layers of these semiconductor materials can also form the bulk semiconductor. In accordance with embodiments of the present invention, the substrate 101 comprises a single crystalline semiconductor material, such as, for example, single crystalline silicon, or a polycrystalline or amorphous semiconductor material.

In accordance with embodiments of the present invention, the gate structures 110 may have a same conductivity (e.g., n– or p–) or different conductivities. Each gate structure 110 can include a gate dielectric layer, a gate conductor layer stacked on the gate dielectric layer, and a hard mask layer (e.g., hard mask layer 114) stacked on the gate conductor layer. The gate dielectric layer can include a dielectric material such as, for example, silicon oxide, silicon nitride, silicon oxynitride, a dielectric metal oxide or any multilayered stack thereof. The gate conductor layer can include a conductive material including, for example, doped polysilicon, a doped silicon germanium alloy, an elemental metal, an alloy containing at least two elemental metals, a metal semiconductor alloy and any multilayered combination thereof.

Referring to FIG. 1, the spacers 112 have a first edge located on a vertical sidewall of each gate structure 110 and a base that is located on the surface of substrate 101. The spacer 112 can include a dielectric insulating material such as, for example, silicon oxide, silicon nitride, silicon oxynitride, boron nitride, silicon boron nitride, or multilayered stacks thereof. In some embodiments, the spacer 112 can be composed of a same or different material as that of the hard mask layer 114.

In some embodiments of the present disclosure, the pitch of the gate structures 110, i.e., the distance from a central portion of one gate structure to a central portion of an adjacent gate structure, is about 65 nm or less, but is not limited thereto.

It is to be understood that embodiments of the present invention are applicable to various semiconductor devices, including, but not limited to, planar (as shown), fin field-effect transistor (FinFET) and gate all-around FET (nanowire) devices.

Figure 2:
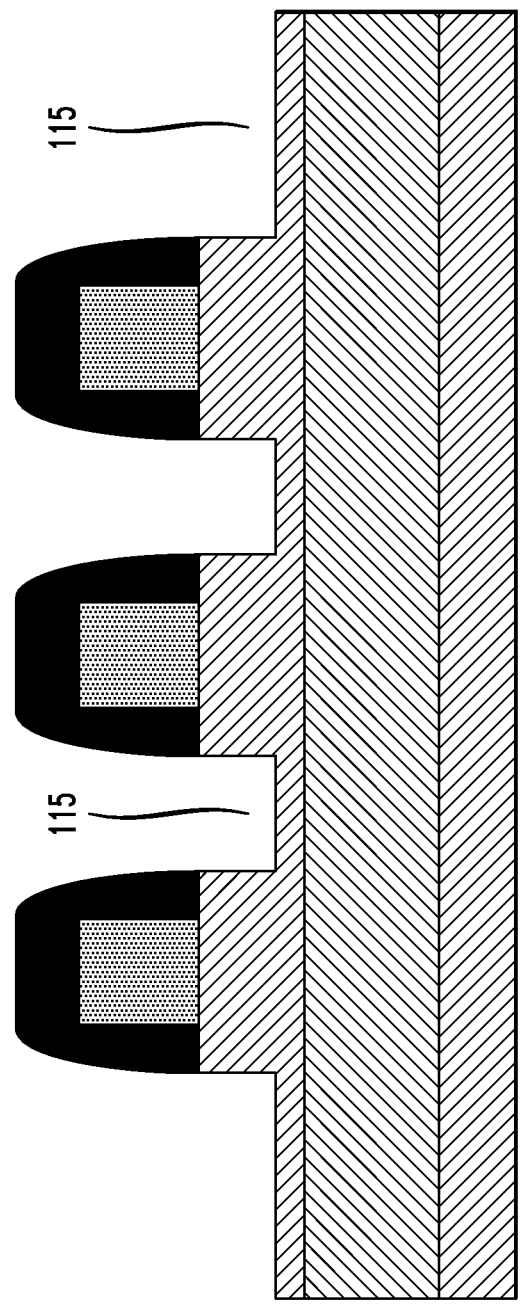
FIG. 2 is a cross-sectional view illustrating formation of source/drain recess in a method of manufacturing a semiconductor device, according to an exemplary embodiment of the invention.

Referring to FIG. 2, source/drain recess regions 115 formed by, for example, etching of portions of the substrate 101, are positioned between and to the side of the gate structures 110. While the source/drain region is recessed as shown in FIG. 2, recessing of the source/drain region is optional and may be omitted.

Figure 3A:
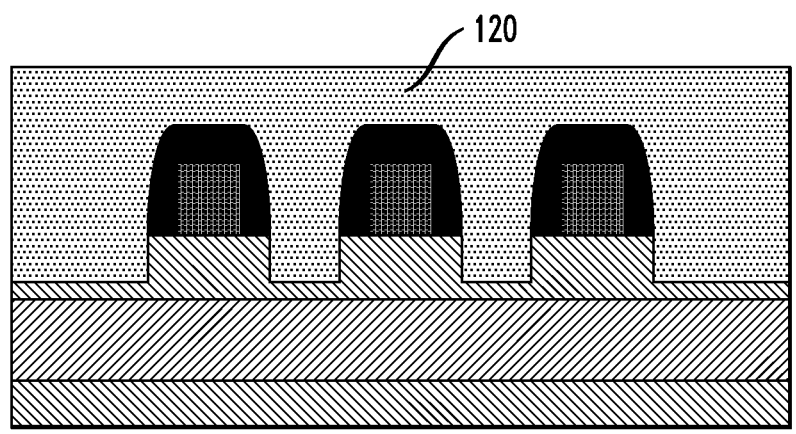
FIG. 3A is a cross-sectional view illustrating source/drain epitaxial overgrowth with a merged source/drain region in a method of manufacturing a semiconductor device, according to an exemplary embodiment of the invention.

Referring to FIG. 3A, a source/drain epitaxial region 120 including, for example, doped or undoped silicon (Si), silicon germanium (SiGe), gallium arsenide, indium gallium arsenide, indium arsenide or indium phosphide, is overgrown. According to an embodiment, the source/drain epitaxial region 120 is overgrown and merged over the active region Rx, and then patterned by, for example, reactive ion etching (RIB) to result in the structure shown in FIG. 3B having openings 121 preventing merging of the gate structures 110.

It is noted that because the opening is formed at a location over the width of the gate structures 110, there is a relatively wide margin for error due to misalignment, wherein some misalignment during RIE will not have an adverse effect on the design and/or operation of the resulting device.

Figure 3B:
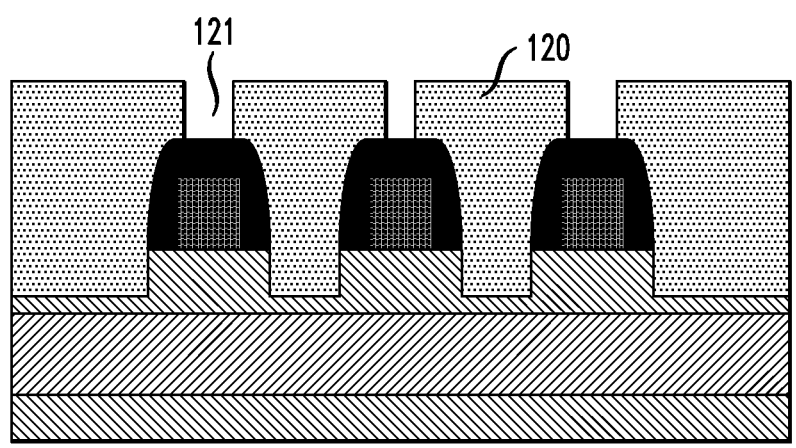
FIG. 3B is a cross-sectional view illustrating a patterning of merged source/drain region from FIG. 3A or a result of source/drain epitaxial overgrowth without a merging of the source/drain region in a method of manufacturing a semiconductor device, according to an exemplary embodiment of the invention.
Figure 4:
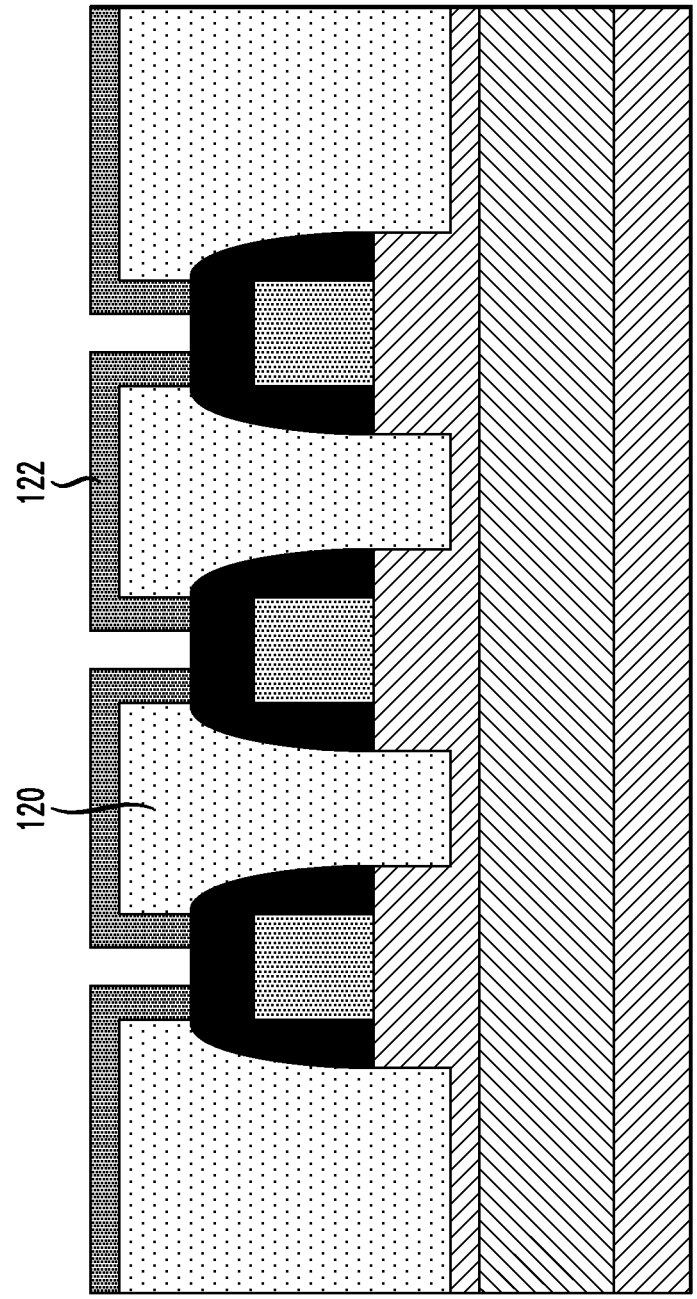
FIG. 4 is a cross-sectional view illustrating formation of a silicide layer in a method of manufacturing a semiconductor device, according to an exemplary embodiment of the invention.

Alternatively, the overgrowth of the source drain epitaxy region 120 is controlled so that there is no merging, resulting in the structure shown in FIG. 3B without requiring the patterning step by RIE. As can be seen in FIGS. 3A and 3B, the source/drain epitaxy region is formed to a height over the gates 110 (e.g., greater than about 5 nm over the gates) so that the gates 110 and surrounding spacers 112 can be protected by the source/drain epitaxy region 120 during formation of the contact area. Referring to FIG. 4, a silicide layer 122 is formed and patterned on the source/drain epitaxy region 120.

Figure 5:
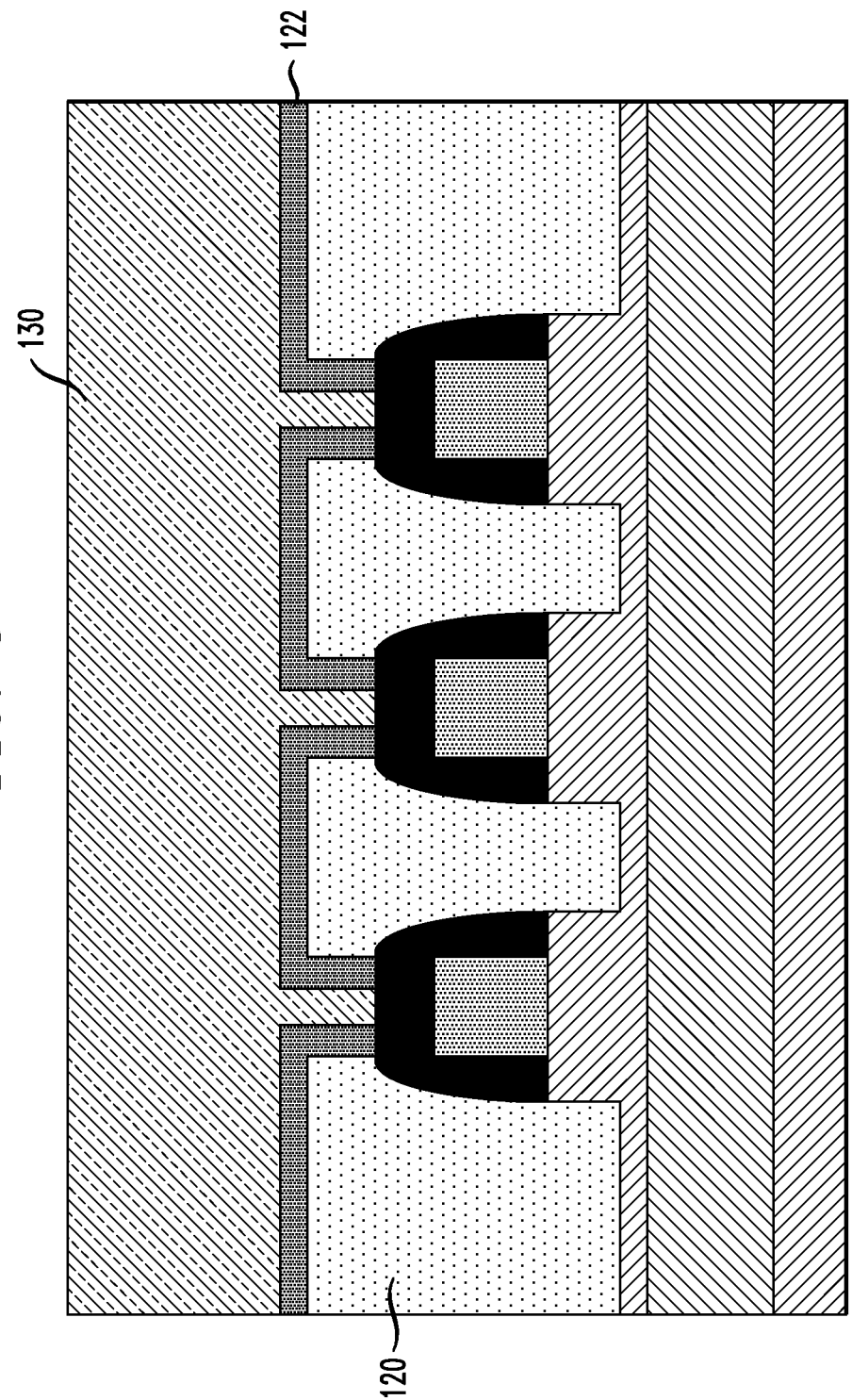
FIG. 5 is a cross-sectional view showing formation of a middle of the line (MOL) dielectric in a method of manufacturing a semiconductor device, according to an exemplary embodiment of the invention.

Referring to FIG. 5, a middle of the line (MOL) dielectric layer 130 is formed and patterned on the silicide layer 122, and exposed portions of the hard mask 114. The MOL dielectric layer 130 is deposited and planarized. Planarization of the MOL layer 130 can be performed by a process such as chemical mechanical planarization (CMP). The MOL dielectric layer 130 can be deposited using, for example, plasma enhanced chemical vapor deposition (PECVD), flowable (F)-CVD or spin-coating, and can be an oxide, such as, for example, silicon oxide, SiCOH based oxide, or other dielectrics, including but not limited to, low-K dielectrics. It is to be understood that the dielectric layer 130 is not necessarily limited to an MOL layer, and may be, for example, a combined MOL and first metallization dielectric.

Figure 6:
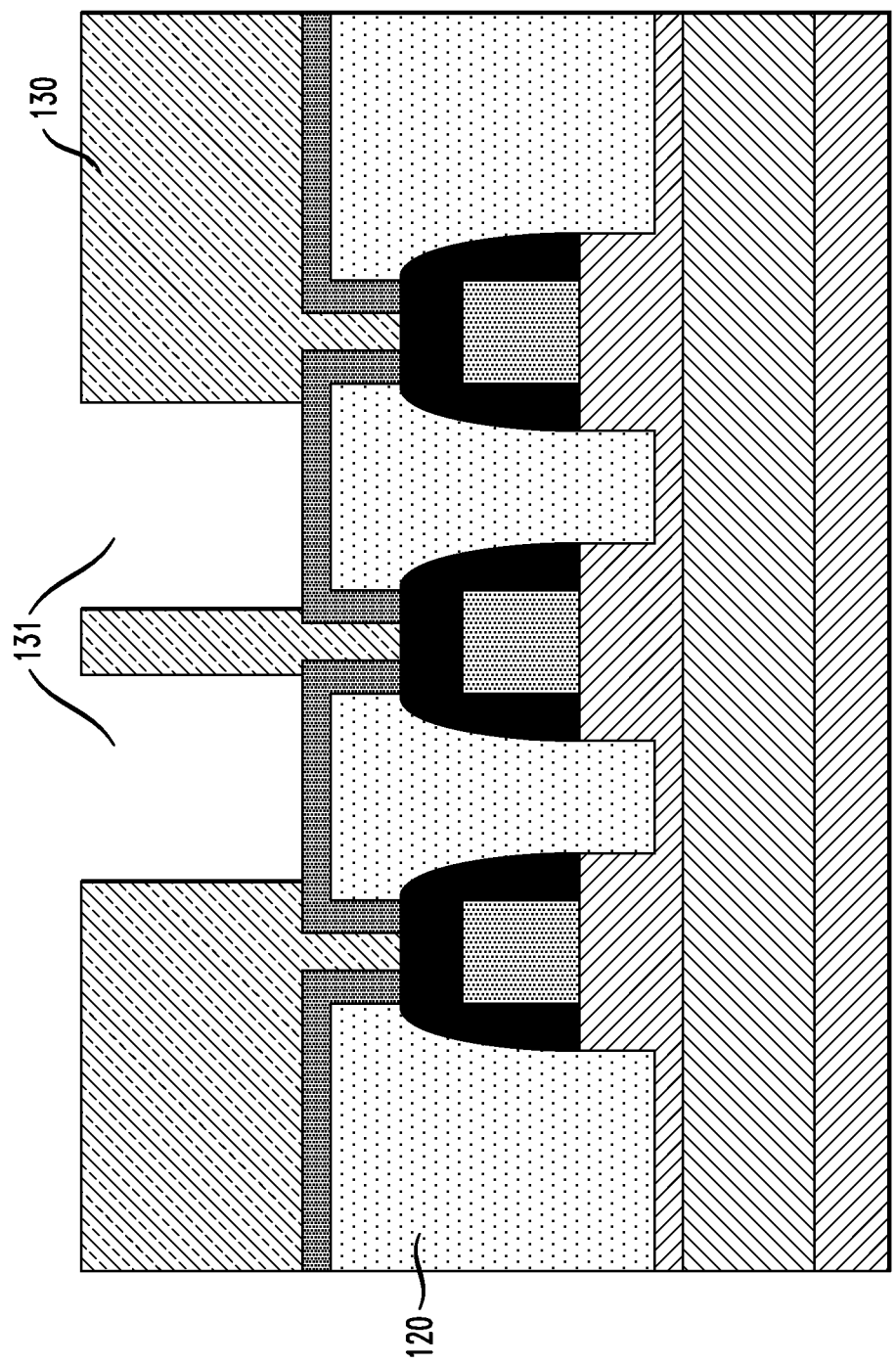
FIG. 6 is a cross-sectional view illustrating etching of the MOL dielectric to form a contact area in a method of manufacturing a semiconductor device, according to an exemplary embodiment of the invention.

Referring to FIG. 6, etching, such as, for example, RIE is performed on the MOL dielectric layer 130 to open up contact areas 131 where a conductor can be deposited. As can be seen, due to the raised source/drain region 120, RIE of the MOL dielectric layer can be spaced apart from the spacers 112 and hard mask 114 so as not to etch the spacers and hard mask 114 and prevent gate to source/drain shorts. Given the positioning of the MOL dielectric over the gates 110, when creating the contact areas there is a wide margin for etching and/or lithography, which can be especially beneficial to prevent extra hard mask loss. Due to the structure of the thick/raised source/drain region 120, the contact areas 131 are not required to be fitted between the gate structures 110, thereby eliminating loss of the spacer and hard mask layers 112, 114 and misaligned contact areas.

Figure 7:
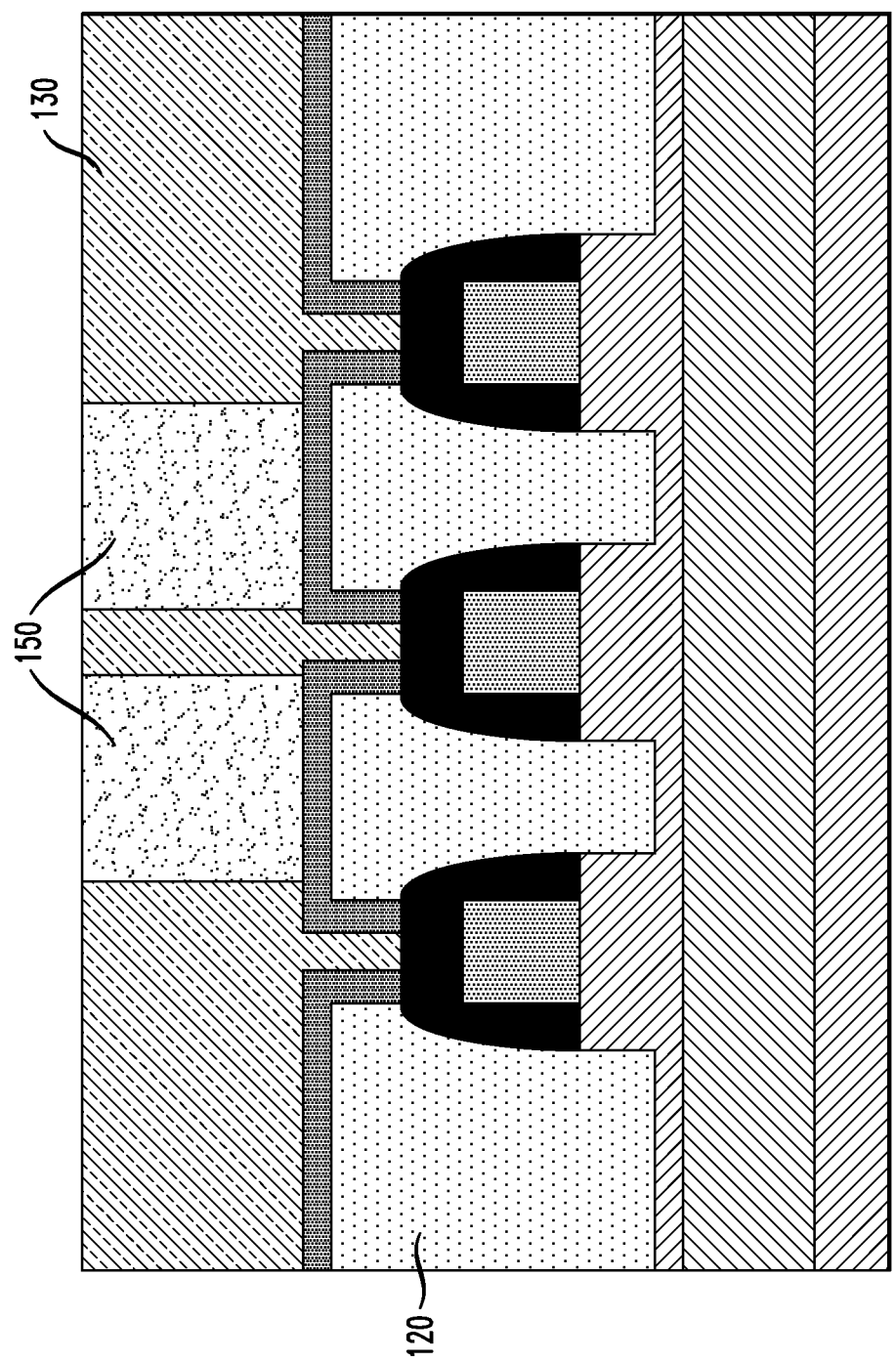
FIG. 7 is a cross-sectional view illustrating deposition of a conductor in a method of manufacturing a semiconductor device, according to an exemplary embodiment of the invention.

Referring to FIG. 7, a conductor 150, such as, for example, copper (Cu) or tungsten (W), is deposited by, for example, a dual damascene process, and planarized in a method of manufacturing a semiconductor device, according to an exemplary embodiment of the invention. As can be seen, the conductor 150 is deposited in the contact area 131 between the portions of the MOL dielectric 130. Planarization is performed using, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, the method comprising:
    growing a source/drain epitaxy region over a plurality of gates on a substrate, wherein a top surface of the source/drain epitaxy region is at a height above a top surface of each of the plurality of gates;
    forming at least one opening in the source/drain epitaxy region over a top surface of at least one gate;
    forming a silicide layer on the source/drain epitaxy region, wherein the silicide layer lines lateral sides of the at least one opening;
    depositing a dielectric layer on the silicide layer, wherein the dielectric layer is deposited in the at least one opening between the silicide layer on lateral sides of the at least one opening;
    etching the dielectric layer to form a contact area; and
    depositing a conductor in the contact area.

2. The method according to claim 1, wherein forming the at least one opening comprises patterning the source/drain epitaxy region to remove a portion of the source/drain epitaxy region at a location corresponding to the at least one opening.

3. The method according to claim 1, wherein forming the at least one opening comprises stopping epitaxial growth of the source/drain epitaxy region prior to merging.

4. The method according to claim 1, wherein the dielectric layer is on the silicide layer on the top surface of the source/drain epitaxy region.

5. The method according to claim 1, wherein the contact area comprises at least one opening in the dielectric layer formed to expose the silicide layer on the top surface of the source/drain epitaxy region.

6. The method according to claim 5, wherein the conductor is deposited in the at least one opening in the dielectric layer and a bottom surface of the conductor is at a height above the top surface of each of the plurality of gates.

7. The method according to claim 6, wherein the conductor is a middle of the line conductor.

8. The method according to claim 5, wherein the conductor is deposited in the at least one opening in the dielectric layer and does not extend between the plurality of gates.

9. A semiconductor device, comprising:
    a substrate;
    a plurality of gates on the substrate;
    a source/drain region formed over the plurality of gates on a substrate, wherein a top surface of the source/drain region is at a height above a top surface of each of the plurality of gates;
    at least one opening in the source/drain epitaxy region over a top surface of at least one gate;
    a silicide layer formed on the source/drain region, wherein the silicide layer lines lateral sides of the at least one opening;
    a dielectric layer formed on the silicide layer, wherein the dielectric layer includes at least one contact area formed in the dielectric layer, and wherein the dielectric layer is formed in the at least one opening between the silicide layer on lateral sides of the at least one opening; and
    a conductor formed in the at least one contact area.

10. The semiconductor device according to claim 9, wherein the dielectric layer is on the silicide layer on the top surface of the source/drain epitaxy region.

11. The semiconductor device according to claim 9, wherein the at least one contact area comprises at least one opening in the dielectric layer formed to expose the silicide layer on the top surface of the source/drain region.

12. The semiconductor device according to claim 11, wherein the conductor is in the at least one opening in the dielectric layer and a bottom surface of the conductor is at a height above the top surface of each of the plurality of gates.

13. The semiconductor device according to claim 12, wherein the conductor is a middle of the line conductor.

14. The semiconductor device according to claim 11, wherein the conductor is in the at least one opening in the dielectric layer and does not extend between the plurality of gates.

15. The semiconductor device according to claim 11, wherein the conductor is in the at least one opening in the dielectric layer and does not extend below the top surface of each of the plurality of gates.

16. A method for manufacturing a semiconductor device, the method comprising:
- growing a source/drain epitaxy region to a height above a plurality of gates on a substrate;
- forming a plurality of openings in the source/drain epitaxy region respectively over top surfaces of each of the plurality of gates;
- forming a silicide layer on the source/drain epitaxy region, wherein the silicide layer lines lateral sides of the plurality of openings; and
- depositing a dielectric layer on the silicide layer, wherein the dielectric layer is deposited in the plurality of openings between the silicide layer on lateral sides of the plurality of openings.

17. The method according to claim 16, further comprising:
- etching the dielectric layer to form a contact area; and
- depositing a conductor in the contact area.

18. The method according to claim 17, wherein the contact area comprises at least one opening in the dielectric layer formed to expose the silicide layer on a top surface of the source/drain epitaxy region.

19. The method according to claim 18, wherein the conductor is deposited in the at least one opening in the dielectric layer and a bottom surface of the conductor is at a height above the top surface of each of the plurality of gates.

\* \* \* \* \*